Aug. 10, 1965 A. E. SLADE ETAL 3,200,262
THIN-FILM CRYOTRON UTILIZING ONLY MAGNETIC-FIELD LINES-OF-FORCE THAT LIE IN PLANE PARALLEL TO GATE CONDUCTOR PLANE
Filed Feb. 8, 1962 2 Sheets-Sheet 1

INVENTOR.
ALBERT E. SLADE
JOHN L. MILES
BY
Blair & Buckles
ATTORNEYS

INVENTORS
ALBERT E. SLADE
JOHN L. MILES
BY
Blair & Buckles
ATTORNEYS

United States Patent Office 3,200,262
Patented Aug. 10, 1965

3,200,262

THIN-FILM CRYOTRON UTILIZING ONLY MAGNETIC-FIELD LINES-OF-FORCE THAT LIE IN PLANE PARALLEL TO GATE CONDUCTOR PLANE

Albert E. Slade, Cochituate, and John L. Miles, Belmont, Mass., assignors to Arthur D. Little, Inc., Cambridge, Mass.

Filed Feb. 8, 1962, Ser. No. 171,888
7 Claims. (Cl. 307—88.5)

Figure 1:
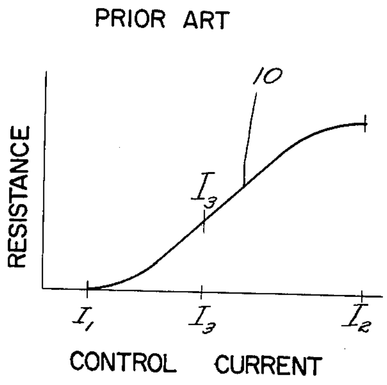

This invention relates to an improved deposited cryotron construction requiring only a small change in control current to effect a complete change in the resistive state of the gate conductor. More particularly, it relates to a superconductive switching element in which the entire gate portion is sandwiched between the control conductor and a superconductive ground plane conductor.

The cryotron is described in an article by D. A. Buck, entilted "The Cryotron—A Superconductive Switching Element," Proceedings of the IRE, vol. 44, No. 4 (April 5, 1956), pp. 842–293. Briefly, it compaires a superconductive gate element which is "quenched," i.e., rendered resistive, by the magnetic field resulting from current conductor in close proximity to the gate element. A current can be switched through a selected one of several parallel-connected gate conductors by passing currents through conductors associated with unselected gate conductors. This permits one to devise switching arrangements similar to those used in more conventional types of circuitry as well as devices whose logical functions are, as practical matter, peculiar to superconductive devices.

Generally, cryotron control conductors are super-conductive and of materials which have higher quenching fields than the gate conductors whose conductive states are controlled by them. Thus, the control conductors remain superconductive throughout operation of the devices. Furthermore, the control conductor of one cryotron may be in series with the gate conductor of another cryotron and, with proper design, the current required for quenching of a gate conductor by the control conductor is less than the current whose magnetic field results in self-quenching of a gate conductor. This means that cryotrons can be constructed with gain. More specifically, the change in gate current resulting from transition between the resistive and superconductive states of a gate conductor is more than enough to bring about a change of state in a second gate conductor controlled by a conductor in series with the first gate conductor. The possibility of gain is demonstrated in the above Buck article for a crytron in which the control conductor is in the form of a coil wound around the gate conductor.

In an improved cryotron constructon, the control and gate conductors take the form of thin films, with control conductors passing over the gate conductors where quenching is to take place. Again, a gain of greater than unity can be obtained, this time by making the width of each gate conductor greater than that of the control conductors in series therewith. The self-field of the gate conductor is therefore less than the fields generated by the control conductors, and currents of quenching intensity in the later conductors do not cause self-quenching of the gate conductors. Cryotrons of this general type are described in "Thin-Film Cryotrons," by C. R. Smallman, et al., Proceedings of the IRE, September 1960, pp. 1562–1582.

The Smallwood et al. article also describes the use of a superconductive ground plane on which the thin film cryotrons are disposed. The ground plane has several beneficial effects on operation resulting from the fact that it reduces the magnetic fields generated by currents through conductors in close proximity to it. This is tantamount to a reduction in inductance, with a corresponding increase in speed of operation. Also, with a weaker self field, the current which a conductor can carry without quenching itself is increased. A further effect is the steepening of the resistance-versus-control current characteristics of cryotrons deposited on the ground plane. This effect is discussed in detail below.

Figure 2:
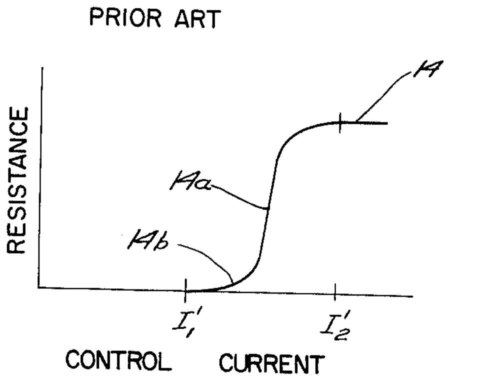
Figure 3:
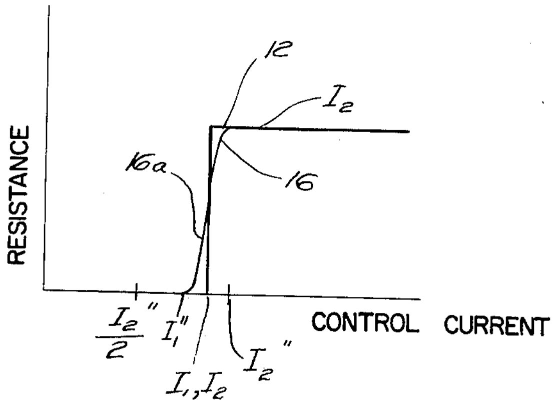
Figures 4, 5, 6:
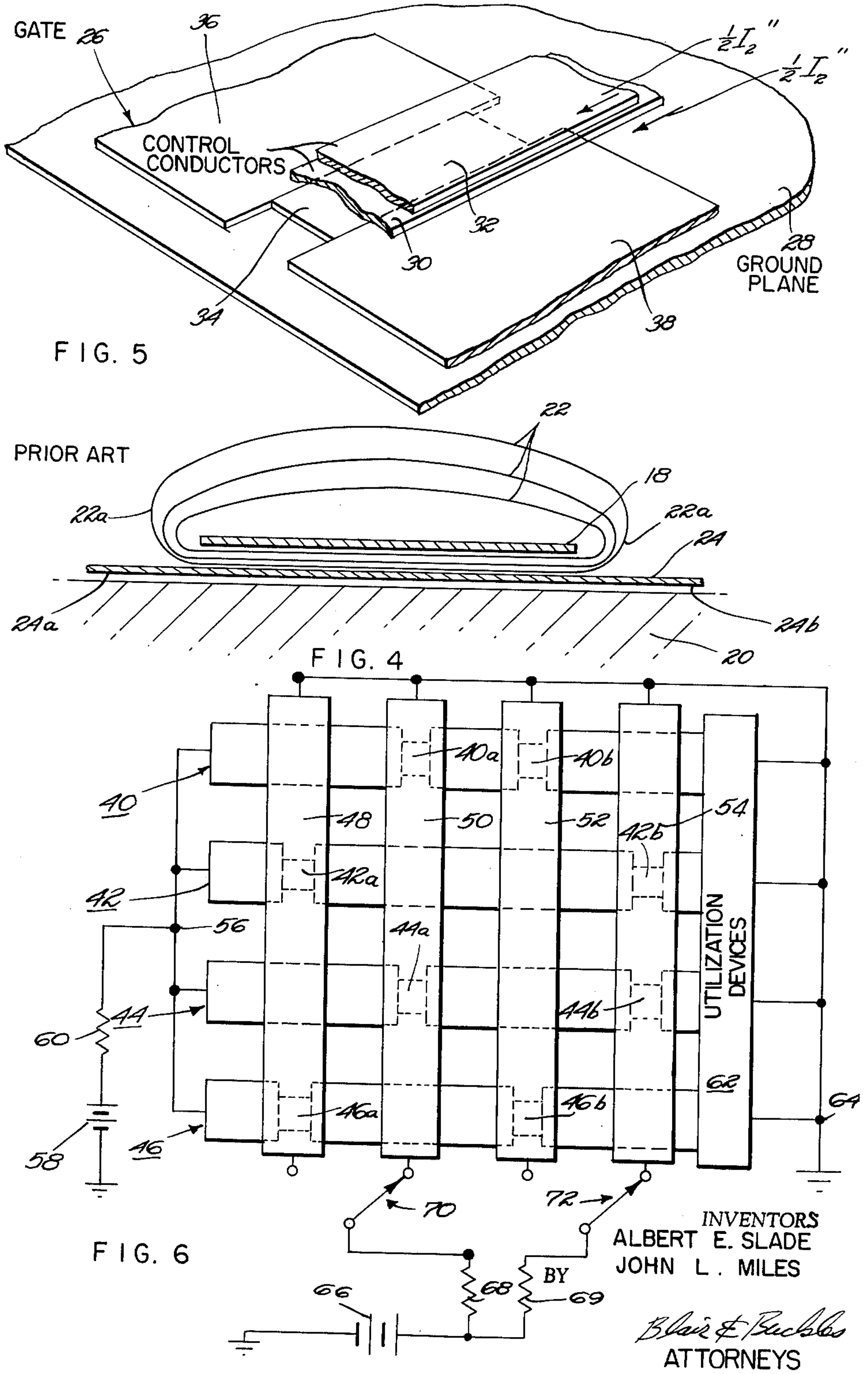

For a fuller understanding of the nature and objects of invention, reference should be had to the following detailed description taken in connection with the accompanying drawings, in which:

FIG. 1 is a graphic illustration of the gate conductor resistance characteristic of a thin film cryotron in the absence of a superconductive ground plane, FIG. 2 is a graphic illustration of a typical gate conductor resistance characteristic for a cryotron provided with a superconductive ground plane, FIG. 3 is a graph comparing the gate conductor characteristic of an idealized cryotron and a cryotron embodying the features of the present invention, FIG. 4 illustrates the magnetic field configuration for a thin film conductor in close proximity to a superconductive ground plane, FIG. 5 is a perspective view of a cryotron made according to our invention, and FIG. 6 is a simplified illustration of a rectangular switch comprising cryotrons embodying our invention.

In FIG. 1, the curve 10 represents the variation of gate conductor resistance of a cryotron in response to a change in the current through the control conductor. As the control current is increased, the gate conductor first becomes resistive at an initial current value $I_1$. From this point, the curve 10 slopes gradually upward until it levels off at a maximum resistance value when a control current value $I_2$ is attained. The relatively large ratio, $I_2/I_1$, is undesirable. In the first place, optimum operation is obtained when a quenched gate conductor is brought to its ultimate resistance, since the speed of operation of cryotron circuits increases with the resistances of the quenched gate conductors therein. Some crytrons are coincident current devices in which the coincidence of currents in two control conductors is required to quench the gate conductor. Each control conductor carries one half the quenching current, a value insufficient to render the gate conductor resistive, whereas, with the coincidence of the two control currents, the full quenching field value is obtained.

However, it is apparent from FIG. 1 that, if the gate conductors resistance corresponding to the current $I_2$ is desired in a coincident current cryotron, one half the corresponding field, i.e., the field resulting from the current through a single one of the control conductors, will also cause quenching of the gate conductors. In order for the gate conductor to remain superconductive with a half unit of current, the current value for a full unit must be reduced, for example to a value $I_3$. This results in a relatively low resistance for the quenched gate conductor, with corresponding inefficient operation.

In general, a figure of merit for a cryotron might be associated with the ratio $I_2/I_1$, the ideal ratio being unity as in the idealized curve 12 of FIG. 3. As the ratio approaches unity, a smaller swing in control current is required to shift the gate conductor between its superconductive and resistive states. Since a bias current might be provided to bring the gate conductor close to the point corresponding to the current $I_1$, a close-to-unity value of $I_2/I_1$ corresponds to optimum gain in a cryotron circuit.

As illustrated by the curve 14 of FIG. 2, the use of a superconductive ground plane in close proximity to a thin film cryotron steepens the main portion 14*a* of the curve and provides a substantially reduced current ratio, $I_2'/I_1'$. However, there is still a substantial "toe" portion 14*b* in the curve. We have found that as a result $I_2'/I_1'$ may range as high as two or three, an excessive value where coincident current operation is desired.

Accordingly, it is a principal object of our invention to provide an improved thin film cryotron.

A more specific object of the invention is to provide a thin film cryotron having a relatively small ratio of control current values corresponding to initial and ultimate gate conductor resistance.

A further object of the invention is to provide a coincident current cryotron having the above characteristics.

Yet another object of the invention is to provide a logical array of superconductive switches having the above characteristics.

Other objects of the invention will in part be obvious and will in part appear hereinafter.

The invention accordingly comprises the features of construction, combinations of elements, and arrangement of parts which will be exemplified in the constructions hereinafter set forth, and the scope of the invention will be indicated in the claims.

We have found that the toe portion 14*b* in FIG. 2 is due in large part to the normal component of control conductor field in the plane of the portion of the gate conductor which is to be quenched by the control conductor. By largely eliminating this component, the toe is eliminated and the characteristic curve 16 of FIG. 3 is obtained. With the construction described in detail below, our measuring techniques indicate a complete elimination of the toe, with the main portion 16*a* of the curve meeting the control current axis.

More specifically, as seen in FIG. 4, current through a thin film control conductor 18, spaced above a superconductive ground plane 20, develops a magnetic field indicated by lines of force 22. The magnetic field cannot penetrate the ground plane 20, and, therefore, in the neighborhood of the ground plane, the magnetic field is parallel to the ground plane and control conductor. It is also parallel to an unquenched gate conductor 24 disposed between the control conductor and ground plane. However, since the lines of force form closed loops around the control conductor 18, they must have vertical portions as indicated at 22*a*. The lines 22 bend toward the horizontal as they approach the conductor 24, which acts as a superconductive ground plane, but they still have vertical components normal to this conductor as they pass close to it.

It will be noted that, when the current in the control conductor 18 reaches the minimum value for quenching of the gate conductor 24, the gate conductor no longer serves as a ground plane, and the lines of force 22 pass through it toward the ground plane 20.

The manner in which we prefer to eliminate the normal component of control conductor field adjacent to the unquenched gate conductor is illustrated in FIG. 5. As shown, therein, a coincident current cryotron has a gate conductor, generally indicated at 26, in close proximity to a ground plane 28. A pair of control conductors 30 and 32 are disposed in register with each other over the gating section 34 of the gate conductor 26.

More specifically, the gate conductor 26 includes linking sections 36 and 38 composed of a material requiring a relatively high field for quenching, whereas the gating section 34 is of a material having a relatively low quenching field. For example, the section 34 may be of tin and the sections 36 and 38 of lead. The control conductors 30 and 32 may also be of lead, a material which may additionally be used for the ground plane 28. It should be understood that thin layers of suitable insulating material are interposed between the ground plane 28 and gate conductors 26, between the gate conductor and the control conductor 30 and also between the control conductors 30 and 32, the insulation having been omitted from the drawings for the purpose of clarifying the features of the present invention.

With further reference to FIG. 5, it is noted that the length of the section 34 of the gate conductor (i.e., the dimension along the gate conductor, extending between the sections 36 and 38) is less than the width of the control conductors 30 and 32. Moreover, the width of the section 34 is preferably less than that of the sections 36 and 38. With this overlapping of the control conductors and the sections 36 and 38, a current in either one of the control conductors develops a magnetic field which, in the region of overlap, is confined to a substantially parallel relationship with the gate conductor 26. The vertical components of the field are along the edges of the control conductors and thus a substantial distance from the quenchable section 34. Thus, until the field strength is sufficient to quench the section 34, there is essentially no normal component of magnetic field at or closely adjacent to the latter section. As pointed out above, it is believed that the presence of this normal component at the portion of the gate conductor to be quenched results in the toe portion 14*b* of the FIG. 2 characteristic. In any case, the construction of FIG. 5 results in the characteristic curve 16 of FIG. 3, in which the toe portion has been virtually eliminated.

It will be apparent that once the section 34 of the gate conductor has been quenched, the magnetic lines of force restuling from control conductor current will have a normal component, i.e., they will extend down into and then across this section. However, this effect does not take place until a significant amount of quenching has occurred, corresponding to a substantially greater control field relative to the control field for complete quenching, as compared with the prior constructions, whose characteristics are illustrated in FIGS. 1 and 2.

Thus, when operated as a coincident current device, each of the control conductors 30 and 32 may carry substantially half the current $I^{2''}$ required for complete quenching of the sections 34. The coincidence of current in the conductors 30 and 32 will then provide complete quenching, whereas a current through a single one of the control conductors will result in no quenching at all, as will be apparent from a study of the relative values in FIG. 3. The full current $I^{2''}$ is, of course, insufficient for quenching of the lead used in the sections 36 and 38 and the control conductors 30 and 32.

Typically, the spacing between the various conductors FIG. 4 may amount to 3000 Angstom units; the width of sections 36 and 38 may be 0.070 inch; the width of the control conductors 30 and 32 may be 0.006 inch and the "length" of the section 34 somewhat less; the "width" of the section 34 may be about 0.060 inch.

In FIG. 6 we have illustrated a multiple position switch embodying our invention. The switch is essentially a matrix type encoder in which a binary input provides an output current on a single selected line. More specifically, it includes gate conductors generally indicated at 40, 42, 44 and 46 arranged in criss-cross fashion with control conductors 48, 50, 52 and 54. The gate conductors are superconductively connected together at junction 56, a battery 58 and current limiting resistor 60 being connected in series between the junction 56 and a common ground return. The connections to the right of the switch are not shown in detail in FIG. 6. However, it will be understood that the individual gate conductors are in series with current utilization devices collectively indicated at 62, ordinarily cryotron control conductors. The utilization devices are superconductively connected together at a grounded junction 64 similar to the junction 56.

Still referring to FIG. 6 the control conductors 48–54 are supplied with current from a source including a battery 66 and series resistors 68 and 69, by way of switches 70 and 72. Each of the switches 70 and 72 may contact either one of two control conductors, and, for the purpose of binary coding, one position of each switch may be termed a ZERO position and the other a ONE position. The gate conductors 40–46 are provided with logically arranged quenching sections, designated with the letters *a* and *b*, of the type described above.

With the switches 70 and 72 in the position shown, currents flow in the control conductors 50 and 54. The value of the resistors 68 and 69 is such that each of these currents is sufficient to cause quenching of the quenching sections beneath the current-carrying control conductors. Thus, there is quenching of the sections 40*a*, 44*a*, 42*b* and 44*b*, with resulting resistance in the gate conductors 40, 42 and 44. The conductor 46 remains fully superconductive, and therefore all the current from the battery 58 flows through this conductor. Re-arrangement of the setting of the switches 70 and 72 effects the selection of different superconductive gate conductors.

Thus, we have described an improved thin film cryotron construction having a much more abrupt transition characteristic than prior cryotrons of this type. In effect, this provides a substantial increase in the gain of the cryotron and also facilitates the use of coincident current control of the gate conductor resistivity. The improvement results from the elimination of components of the control field perpendicular to the quenchable portions of the gate conductor prior to quenching thereof. A simple construction which functions in this manner has been described above in detail. However, it will be apparent that other arrangements providing the desired magnetic field configuration are also within the purview of the present invention.

We have also described a multiple position switch comprising our improved cryotron, and it will be apparent that other arrays of such cryotrons may be constructed to perform various logical functions. This applied to both coincident-current and single-control-conductor cryotrons. For example, coincident current units may be combined in a matrix type memory using persistent current loops as storage elements, as disclosed in the copending application of Albert E. Slade, Serial No. 130,859, for "Superconductive Memory."

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

We claim:

1. A cryotron comprising in combination
(A) a superconductive gate conductor having at least a quench portion, and
(B) control conductor means
(1) developing a magnetic field when it carries current,
(2) disposed to quench the superconductivity of said quench portion with said magnetic field, and
(3) so further disposed that when said gate conductor is superconductive, the magnetic field adjacent said quench portion and developed by current in said conductor means is substantially free of lines of force normal to said quench portion.

2. A cryotron according to claim 1 in which said control conductor means comprises a pair of control conductors each of which overlies said quench portion, said control conductors being arranged to develop magnetic fields that reinforce each other.

3. A cryotron according to claim 1 further comprising a superconductive ground plane conductor, said gate conductor and said control conductor means both being closely spaced from, and on the same side of, said ground plane conductor.

4. A cryotron comprising in combination
(A) a strip-like superconductive gate conductor having
(1) a quenching section in series between a pair of connecting sections,
(2) said quenching section having a weaker quenching field than said connecting sections,
(B) at least a first control conductor
(1) overlying said quench section with a first planar surface facing said quench section.
(2) said first surface being at least coextensive with the opposed surface of said quench section whereby, when said quench section is superconductive, the magnetic field produced by current in said control conductor is substantially free of lines of force normal to said quench section at the region of space between said quench portion and said control conductor.

5. The combination defined in claim 4 including a superconductive ground plane, said control conductor and said gate conductor being substantially parallel to and in close proximity to said ground plane.

6. The combination defined in claim 5 including a second control conductor having a portion parallel to and overlying the portion of said first control conductor overlying said quenching section.

7. A cryotron comprising a combination
(A) a strip-like superconductive gate condutor
(1) having a quenching section in series between a pair of connection sections,
(2) said quenching section having a width less than the width of each of said connecting sections so that said quenching section has a weaker quenching field than said connecting sections, and
(B) at least a first strip-like control conductor
(1) having a portion overlying said quench section closely spaced therefrom,
(2) the portion of said control conductor overlying said quench section having lateral dimensions larger than the lateral dimensions of said quench section so that said overlying portion overlaps beyond said quench section.

References Cited by the Examiner

UNITED STATES PATENTS

| | | | |
|---|---|---|---|
| 2,989,714 | 6/61 | Park | 307—88.5 |
| 3,055,775 | 9/62 | Crittenden | 307—88.5 |
| 3,078,445 | 2/63 | Sass | 307—88.5 |
| 3,093,754 | 6/63 | Mann | 307—88.5 |

OTHER REFERENCES

Buck, The Cryotron, "A Super Conductive Computer Component," Proc. I.R.E., April 1956, Figure 10.

Part II, Cryotron Characteristics and Circuit Applications by A. E. Slade, Proceedings of the IRE, September 1960, pp. 1569–1571.

Newhouse, "Superconductive Circuits for Computing Machines," Electrotechnology April 1961.

ARTHUR GAUSS, *Primary Examiner.*

NEIL C. READ, *Examiner.*